United States Patent
Andreev et al.

(10) Patent No.: US 6,453,453 B1
(45) Date of Patent: Sep. 17, 2002

(54) PROCESS FOR SOLVING ASSIGNMENT PROBLEMS IN INTEGRATED CIRCUIT DESIGNS WITH UNIMODAL OBJECT PENALTY FUNCTIONS AND LINEARLY ORDERED SET OF BOXES

(75) Inventors: Alexander E. Andreev, San Jose, CA (US); Anatoli A. Bolotov, Cupertino, CA (US); Pedja Raspopovic, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 21 days.

(21) Appl. No.: 09/833,142

(22) Filed: Apr. 11, 2001

(51) Int. Cl.[7] .................................................. G06F 9/45
(52) U.S. Cl. ............................................. 716/10; 716/2
(58) Field of Search ........................... 716/2, 4, 10, 11, 716/13, 14

(56) References Cited

U.S. PATENT DOCUMENTS 5,933,356 A * 8/1999 Rostoker et al. ............ 364/489
6,321,370 B1 * 11/2001 Suzuki et al. ................ 716/10
6,378,109 B1 * 4/2002 Young et al. .................. 716/4

* cited by examiner

Primary Examiner—Don Wong
Assistant Examiner—Jimmy T Vu
(74) Attorney, Agent, or Firm—Westman, Champlin & Kelly

(57) ABSTRACT

A linear assignment problem for an ordered system containing a plurality of boxes each containing an object having an associated penalty function is solved. A hierarchy contains a bottom level containing at least as many generalized boxes as there are boxes in the assignment problem, and top and intermediate levels. The objects of the assignment problem are placed in the generalized box of the top level. A first local task is executed to transition the contents of a generalized box of a higher level to at least two generalized boxes of the next lower level. A second local task is executed on the generalized boxes of the lower level to minimize a global penalty function. The first and second tasks are executed through successive iterations until all of the objects are placed in the generalized boxes in the bottom level in a layout having minimal penalty function.

20 Claims, 1 Drawing Sheet

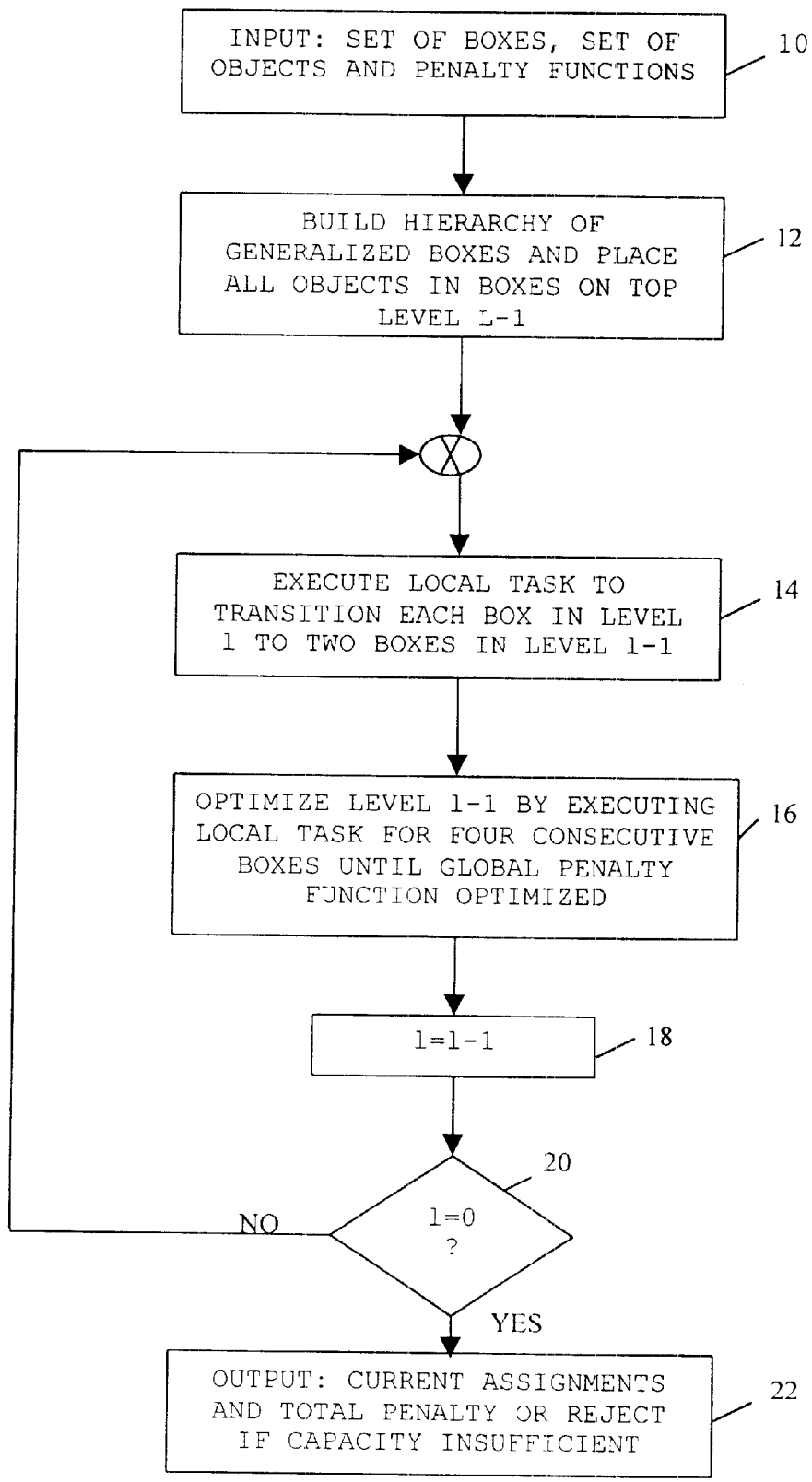

PROCESS FOR SOLVING ASSIGNMENT PROBLEMS IN INTEGRATED CIRCUIT DESIGNS WITH UNIMODAL OBJECT PENALTY FUNCTIONS AND LINEARLY ORDERED SET OF BOXES

FIELD OF THE INVENTION

This invention relates to solving linear assignment problems often arising for combinational layout problems in integrated circuit design, such as routing and pin and buffer assignment.

BACKGROUND OF THE INVENTION

Linear assignment problems are employed to solve and optimize combinational layout problems for integrated circuit design. For example, combinational channel routing layouts, pin positioning and buffer assignments are often treated as linear assignment problems of placing objects in an ordered system of boxes. Assignment problems are used to locate, in an undirected graph G, a match M that is a subset of an edge E, M ⊆ E, such that no vertex is incident to more than one edge. The linear assignment problem assumes that graph G is complete with edge weights, and seeks a perfect match of minimum weight. The match is called "perfect" if each vertex is incident to exactly one edge.

Integrated circuit design often poses problems of assigning objects to boxes with minimal penalties where the number of object/box combinations exceeds $10^6$. Classical linear assignment problems are ineffective where the number of objects and boxes of the problem reach $10^4$ to $10^6$ or more. Consequently, it was common to reduce the problem to more manageable pieces and solve each piece individually. The solved pieces were re-assembled, and adjustments were made to the solution. However, the reduction and re-assembly processes were difficult, and often introduced unexpected cost functions to the solution. There is, accordingly, a need for a more effective solution to linear assignment problems that can handle large numbers of combinational assignments, such as for use in integrated circuit layout design.

SUMMARY OF THE INVENTION

The present invention provides an effective solution of the linear assignment problem for an ordered system of boxes with linear topology and with unimodal penalty functions for objects.

The present invention provides a process for optimizing a layout of objects in an ordered system of boxes with minimal penalty from a collection of boxes containing the objects. A hierarchy is created containing a top level, a bottom level and one or more intermediate levels. The bottom level contains at least as many generalized boxes as original boxes in the assignment problem. The top and intermediate levels each contains an integer number $$\frac{n}{2} \text{ or } \frac{n+1}{2}$$

generalized boxes where n is the integer number of generalized boxes in the next lower level. The top level contains one generalized box. All objects of the assignment problem are placed in the generalized box of the top level. A first local task is executed to transition the contents of a generalized box of a higher level to at least two generalized boxes of the next lower level. A second local task is executed to the contents of a plurality of generalized boxes of lower level to minimize a global penalty function. Thereafter, the first and second tasks are executed through successive iterations until all of the objects are placed in the boxes of the bottom level in a layout having minimal penalty function.

In one form, the invention is manifest in a computer readable program containing code that, when executed by a computer, causes the computer to perform the process steps to layout the objects.

BRIEF DESCRIPTION OF THE DRAWINGS

The sole FIGURE is a flow chart of one embodiment of the process for carrying out the invention.

DETAILED DESCRIPTION OF THE PREFERRED EMBODIMENTS

The present invention provides an effective solution of the linear assignment problem for an ordered system of boxes with linear topology and with unimodal penalty functions for objects. The solution differs from the classical combinatorial assignment problem by possessing geometrical structure in its system of boxes and penalty functions. Hence, one aspect of the invention might be characterized as a solution to a linear geometrical assignment problem.

A system B of n generalized boxes $b_i$ is defined from the original set of boxes as $B=\{b_0,b_1, \ldots, b_{n-1}\}$, where i=0, 1, ..., n−1. The boxes are located on a number of axes OX such that each generalized box $b_i$ is a segment [i,i+1] of an axis. The capacity of each box is equal to some integer $c_i=c(b_i)$. The present invention will also consider generalized boxes of a larger geometric size, usually of some power of 2, but always of the form [i,j], where i and j are both integers and i<j.

The objects are elements from the given set $S=\{S_0,S_1,\ldots S_{m-1}\}$ of arbitrary nature to be placed into boxes, taking into account the capacity constraints of each box and penalty for each placement. For the purposes of the present invention, each object is assumed to occupy the same room value equal to 1.

For each object s∈S the penalty function $f_s(x)$ is given. Therefore, there is a family of penalty functions $F=\{f_s(x)\}$. Typically these penalty functions are inferred when analyzing a particular assignment problem. For points A, B, C, D (depending on s) such that $-\infty \leq A \leq B \leq C \leq D \leq \infty$, each penalty function meets the conditions:

1. $f(x)=\infty$, when $x \leq A$, or $x \geq D$;
2. f(x) is generally decreasing on (A,B) and generally increasing on (C,D); and
3. f(x) has a constant value on (B,C). By analogy with continuous functions having only one local extremum the penalty function can be called "unimodal". The penalty $p_s$ (b) for object s to be inside the generalized box b=[i,j) is estimated by computing the minimal or maximal value, or some other value such as the average value, of the function $f_s(x)$ considered on the interval [i,j).

An assignment A is a valid distribution of objects among the set of boxes. The assignment is valid if the number of objects in each box does not exceed the capacity of the box. Assignment A can be considered as a mapping S→B so that for the object s placed into the box b, b=A(s). Equivalently, assignment A can be considered as a (0,1) matrix, $M_A=(a_{ij})$ where $a_{ij}=1 \Leftrightarrow A(s_i)=b_j$, that is the object $s_i$ placed into box $b_j$. For a valid assignment, $$\sum_{i=0}^{m-1} a_{ij} \le c_j$$

holds true, where $c_j$ is the room capacity of the box $b_j$, $b_j=c(b_j)$.

Every valid assignment A has a corresponding total penalty $$P_A = \sum_{s \in S} p_s(A(s))$$

that summarizes all penalties for the given assignment and therefore can be considered a measure of assignment quality. The goal is to find an assignment with a minimal value of its total penalty.

Local tasks, namely tasks for 2 or 4 boxes, are treated as separate local assignment problems for subsets of objects. In the present invention, these 2 or 4 boxes are consecutive boxes of the same level.

In the case of 2 boxes, a and b, objects s from a subset SS are assigned to 2 boxes only, a and b. Typically, subset SS in this local task will be the contents of a generalized box in level l whose predecessors in the next lower level l—1 are generalized boxes a and b. Objects s from subset SS are ordered in descending order of absolute values, $|p_s(a)-p_s(b)|$. If only one box has enough room for an object s, the object is placed in that box. If both boxes have enough room for object s, the object s is placed in the box with the least penalty. For example, if $p_s(a)<p_s(b)$, the object is assigned to box a. If neither box has adequate room for object s, the process is aborted and a reject report is issued.

In the case of 4 boxes, $a_0, a_1, a_2, a_3$, the subset SS is the contents of these four boxes. First, a 3-dimensional array SortedList[4][4][k] is filled, where subset SS has k objects indexed from 0 to k−1. In a 1-dimensional array SortedList[a][b][i] is filled, where a and b are 2 of the 4 boxes. Objects are written from subset SS according to decreasing order of the value $p_s(a)-p_s(b)$ (not absolute value). When solving this local task, a 1-dimensional array CurrentLocalAssignment is given (or inferred from the global assignment problem) which describes the current assignment of all objects from subset SS to the 4 boxes $a_0, a_1, a_2, a_3$. Thus if CurrentLocalAssignment[i]=1, then the i-th object from subset SS is presently located in box $a_1$.

Next, a 2-dimensional array BoxPenaltyMatrix[4][4] is computed. This 2-dimensional array has the general form BoxPenaltyMatrix[q][r], where $0 \le q$ and $r \le 3$. A minimal value (if it exists) is found for index i such that CurrentLocalAssignment[SortedList[q][r][i]]=q. Stated another way, a search is performed for the first occurrence of object s in box q in SortedList[q][r]. If object s is found in box q, set BoxPenaltyMatrix[q][r]=$p_s(a_q)-p_s(a_r)$; otherwise this ordered pair of indexes (q,r) will be excluded from the search for improving mapping.

Mapping of indexes F:{0,1,2,3}→{0,1,2,3} is improved by a search, resulting in a mapping that is valid and has maximum effect from other valid mappings. The mapping is valid if each shift (defined by mapping) of the form i→F(i) does not exceed the capacity of box F(i) after the shift completed. The mapping has maximum effect if it leads to a maximum decrease of the total penalty for these 4 boxes. The effect of the mapping is determined from the BoxPenaltyMatrix that was computed in the previous step.

The mapping of the indices is improved through as many iterations as is necessary to improve global penalty. For the shift q→r, where r=F(q), index i is retained for which CurrentLocalAssignment[SortedList[q][r][i]]=q. (Eq.1)

The next shift will search for the new index j that satisfies Equation 1, starting with j>i. If j is found, object s is set equal to SortedList[q][r][j]. A shift from the box q to box r is performed, if such a shift is still valid. Upon completion, BoxPenaltyMatrix is rebuilt as previously described and mapping is improved until the global penalty is not further improved.

The global assignment problem is solved on a step-by-step process through a hierarchy tree. The hierarchy is built in the form of a tree having consecutive generalized boxes in each level l, where l=0,1 . . . , L−1 and L is the total number of levels. In a preferred form of the invention, the tree is constructed by forming a plurality of generalized boxes in the bottom level, 0, of the tree. The number n of generalized boxes in level 0 equals the number of boxes in the original problem. The next higher level of the tree is built containing either $$\frac{n}{2}$$

generalized boxes (if n is even) or $$\frac{n+1}{2}$$

generalized boxes (if n is odd), where n is the number of boxes in the lower level. Thus, the number of generalized boxes in a given level above the bottom level is $$n_{l+1} = \frac{n_l}{2} \text{ or } n_{l+1} = \frac{n_l+1}{2},$$

where l is the level number 0,1 . . . , L−2. For example, if there are seven boxes in the original problem, there will be four levels, and the bottom level (l=0) will have 7 generalized boxes, the second level (l=1) will have 4 generalized boxes, the third level (l=2) will have 2 generalized boxes and the top level (l=3) will have 1 generalized box.

Each box j of each level l has a capacity equal to the capacity of the joined boxes of the next lower level, l−1. Thus, a box $j_3$ in the third level has a capacity equal to at least the sum of the capacities of boxes $j_2$ and $j_2+1$ in the next lower level (second level).

In accordance with the present invention, all objects of the original problem are placed in the single generalized box $j_{L-1}$ in the top level, L−1, of the tree. Each box contains objects of an interval. Thus, in the original problem of seven boxes, the single box at top level l=L−1 contains interval [0,7). When the local task of transitioning the contents to a lower level is executed, the contents of the single box in level l=L−1 are divided and distributed to one of two boxes, $j_2$ and $j_2+1$, in level l=L−2 (l=2) so that box $j_2$ contains the interval [0,4) and box $j_2+1$ contains the interval [4,7). Level optimization occurs to optimize the distribution of the objects in boxes $j_2$ and $j_2+1$.

At the next transition to the next lower level, the contents of box $j_2$ are distributed to boxes $j_1$ and $j_1+1$ in level l=1, and the contents of box $j_2+1$ are distributed to boxes $j_1+2$ and $j_1+3$ in level l=1. Hence, box $j_1$ will contain interval [0,2), box $j_1+1$ will contain [2,4), box $j_1+2$ will contain interval [4,6) and box $j_1+3$ will contain interval [6,7). Level optimization is performed on the four boxes of level l=1 to optimize the distribution of objects in boxes $j_1$, $j_1+1$, $j_1+2$ and $j_1+3$. During the transition from level l=1 to l=0, the contents of the boxes in level l=1 are divided among the seven boxes, $j_0$, $j_0+1$, ..., $j_0+6$, in bottom level l=0 for the intervals [0,1), [1,2), [2,3), [3,4), [4,5), [5,6) and [6,7), respectively. Level optimization is again performed on the boxes of level l=0 to optimize the distribution of objects in successive groups of four boxes, namely the group $j_0$, $j_0+1$, $j_0+2$ and $j_0+3$, followed by $j_0+1$, $j_0+2$, $j_0+3$ and $j_0+4$, then $j_0+2$ to $j_0+5$, and then $j_0+3$ to $j_0+6$.

If the original problem contained five boxes, the number of levels would be four, but the bottom level will contain five generalized boxes for intervals [0,1), [1,2), [2,3), [3,4) and [4,5), the second level, l=1, will contain three generalized boxes for intervals [0,2), [2,4) and [4,5), the third level, l=2, will contain two generalized boxes for intervals [0,4) and [4,5), and the top level will contain the single box for interval [0,5).

The present invention optimizes the assignment process through the levels by transitions from an upper level to a lower level and through level optimization. The invention, described in greater detail in the FIGURE, alternates between these two processes.

At step 10, sets of boxes, objects and penalty functions are input to a computer containing program code to carry out the invention. Each penalty function is the penalty function for a corresponding object. At step 12, a hierarchy is built containing generalized boxes. All of the objects are placed in the generalized box $j_{L-1}$ on bottom level l=L-1. For example, if the original problem comprised seven boxes containing the interval [0,7), that interval is placed in the generalized box $j_{L-1}$ of top level l=L-1. At step 14, a transition is made to the lower level l=L-2. In the example where the original problem has seven boxes, the next level is l=2. This transition is performed by solving a local task to distribute the contents of box $j_{L-1}$ in level l=L-1 to boxes $j_2$ and $j_{2+1}$ in level l=2. In the example, applying the local task to transition between levels l=3 and l=2, the contents of box $j_3$ are distributed, using the distribution rules of the first local task described above, to boxes $j_2$ and $j_2+1$ in level l=2. Thus, the contents of box $j_3$ in level l=3 encompassing the interval [0,7) are distributed to boxes $j_2$ and $j_{2+1}$ in level l=2 to contain intervals [0,4) and [4,7), respectively.

After the transition process is completed for a given level, level optimization is performed at step 16 by solving a local task for up to 4 consecutive boxes in level l-1 for the contents of boxes j, j+1, j+2 and j+3. This phase of the process is repeated to optimize four consecutive boxes of j, j+1, j+2 and j+3, followed by j+1, j+2, j+3 and j+4, and so on until all boxes of the level are optimized. In the unique case of level l=L-2, j+2 and j+3 do not exist, and the process is as described above for assignment to two boxes.

At step 16, the penalty function is minimized for the level and the objects assigned to boxes within the level to meet the minimal penalty. This level optimization process of step 16 is repeated for the level until global penalty is minimized.

At step 18, the level number is decremented by 1 (so l=L-2 for the second iteration, if any), and at step 20 a test is made to determine if the new value of l is 0, which is the bottom level. If l=0, the process continues to step 22 to output the current assignment and total penalty, or to reject if the capacity of the boxes is not sufficient. If l≠0, the process loops back to step 14 to perform a transition to the next lower level (l-1 in the second pass) at step 14 and to perform level optimization at step 16. The process continues to loop to optimize each level during successive iterations until l=0, at which time the current assignment and total penalty is output at step 22.

In the example where the original problem consisted of seven boxes, the first iteration of the process through steps 14 and 16 transitions the single box in level l=3 to two boxes in level l=2, with minimized penalty at level l=2. At step 18, l is decremented to l=2, and since 2≠0, the process loops back to step 14 to transition the contents of the two boxes in level l=2, containing the intervals [0,4) and [4,7), to four boxes in level l=1 containing the intervals [0,2), [2,4), [4,6) and [6,7). Level l=1 is optimized at step 16, and at step 18 l is decremented to l=1, and the process loops back to step 14 to transition the contents of the four boxes in level l=1 to seven boxes in l=0. After optimization at step 16, l is decremented to 0 at step 18 and the process ends at step 22.

The process results in an optimal layout of all of the objects in the boxes in the bottom level with minimal penalties. More particularly, the objects previously in the single box $j_{L-1}$ of level L-1 are distributed in an optimal layout with minimum global penalty in boxes $j_0$, $j_0+1$, ..., $j_0+(n-1)$ of bottom level 0, where n is the number of boxes in the original problem.

Upon a transition from one level to another, an object s on level l located in the generalized box j will be placed in box j or j+1 of the next lower level l-1. Objects in box j+1 in level l will be distributed into boxes j+2 and j+3 of lower level l-1. However, final placement of objects s will depend on the result of level optimization.

For level optimization, the local task is performed with 4 consecutive boxes (except in the case where the level has only two or three boxes, in which case level optimization is performed on two consecutive boxes as described above). Consequently, the local task is solved for the contents of boxes j, j+1, j+2 and j+3, and will re-position the objects in those boxes to minimize penalty. With the penalty minimized for four consecutive boxes, the process is repeated using another set of four consecutive boxes that includes three of the boxes from the prior set, until all object placement for all the boxes of the level is completed. Thus, level optimization is performed on boxes j, j+1, j+2 and j+3 until the solution of the local task with four boxes leads to minimization of the global penalty, as described above. The process is then repeated for boxes j+1, j+2, j+3 and j+4, and then for j+2, j+3, j+4 and j+5, so on until the level has been optimized.

The present invention is preferably carried out though use of a computer programmed to carry out the process. A computer readable program code is embedded in a computer readable storage medium, such as a disk drive, and contains instructions that cause the computer to carry out the steps of the process, including defining the hierarchy of levels of generalized boxes and executing the local tasks to transition the contents of a generalized box at one level to plural generalized boxes at a lower level, and to place objects among boxes of the lower level to minimize global penalties. The program code causes the computer to perform as many iterations of the process as is necessary to minimize penalties within a design threshold.

The invention thus provides a process for solving combinational assignment problems possessing geometric structure in the system of boxes and penalty functions. The process employs a hierarchical tree for solving local tasks on each level of the tree to achieve an effective and convenient tool for solving IC layout problems. The assignment problem algorithm can be easily parallelized which would allow effective use on multiprocessor computers. High level of parallelism can be achieved by simultaneous solving several local tasks during level optimization process.

Additionally, while the present invention has been described as transitioning one box of a higher level to two boxes of a lower level, the number N of boxes that may be transitioned may be any convenient number, although it is preferred the number be a multiple of 2 and as small as practical. Thus, the number of boxes in a given level should be $$\frac{n+x}{N},$$

where n is the integer number of boxes in the lower level being transitioned, N is an integer and x is an integer selected from 0,1, . . . , N−1 such that the term $$\frac{n+x}{N}$$

is an integer.

Although the present invention has been described with reference to preferred embodiments, workers skilled in the art will recognize that changes may be made in form and detail without departing from the spirit and scope of the invention.

What is claimed is:

1. A process of optimizing a layout of objects in an ordered system of boxes with minimal penalty from a collection of boxes containing the objects, comprising steps of:
   a) creating a hierarchy containing a plurality of levels each containing generalized boxes such that a bottom level has at least as many generalized boxes as there are boxes in the collection, and each level above the bottom level has fewer generalized boxes than the level below it;
   b) placing all of the objects in a generalized box of a top level;
   c) executing a first local task to transition the contents of a generalized box of a higher level to a plurality of generalized boxes in the next lower level; and
   d) executing a second local task to the contents of the plurality of generalized boxes of the said next lower level to minimize a global penalty function.

2. The process of claim 1, wherein there are intermediate levels between the top level and the bottom level, and each of the top and intermediate levels contains an integer number of generalized boxes of $$\frac{n+x}{N},$$

where n is an integer identifying the number of generalized boxes in the next lower level and N is an integer greater than 1 and x is an integer selected from 0,1, . . . , N−1.

3. The process of claim 2, where N=2.

4. The process of claim 1, including steps of:
   e) iteratively repeating steps (c) and (d) for intermediate levels until all of the objects are in the generalized boxes in the bottom level.

5. The process of claim 1, wherein step (d) is performed by steps of:
   d1) placing each object from a generalized box of a higher level in a generalized box in the lower level having room for the object, and
   d2) if plural generalized boxes in the lower level have room for the object, placing the object in that generalized box in the lower level generating the minimal penalty function.

6. The process of claim 5, wherein step (d2) includes steps of:
   sorting the objects in a three-dimensional array,
   writing objects to two of the generalized boxes in decreasing order of penalty based on a one-dimensional array derived from the three dimensional array,
   computing a two-dimensional penalty matrix for the generalized boxes,
   mapping the position of the objects to the generalized boxes of the level based on the penalty.

7. The process of claim 6, wherein the objects are mapped to as many as four generalized boxes.

8. The process of claim 7, wherein step (d) is repeated to minimize global penalty.

9. The process of claim 8, including
   e) iteratively repeating steps (c) and (d) for intermediate levels until all of the objects are in the generalized boxes in the bottom level.

10. The process of claim 1, wherein step (d) includes steps of:
    sorting the objects in a three-dimensional array, writing objects to two of the generalized boxes in decreasing order of penalty based on a one-dimensional array derived from the three dimensional array,
    computing a two-dimensional penalty matrix for the generalized boxes,
    mapping the position of the objects to the generalized boxes of the level based on the penalty.

11. The process of claim 10, wherein the objects are mapped to as many as four generalized boxes.

12. The process of claim 11, wherein step (d) is repeated to minimize global penalty.

13. A computer usable medium having a computer readable program embodied therein for addressing data, the computer readable program in the computer usable medium comprising:
    first computer readable program code defining a hierarchy containing a plurality of levels each containing generalized boxes such that a bottom level has at least as many generalized boxes as there are boxes in a collection of boxes containing objects whose layout is to be optimized in an ordered system with minimal penalty, and each level above the bottom level has a fewer number of generalized boxes than the level below it;
    second computer readable program code for causing a computer to place all of the objects of the collection in a generalized box of a top level;
    third computer readable program code for causing the computer to execute a first local task to transition the contents of a generalized box of a higher level to a plurality of generalized boxes in the next lower level; and
    fourth computer readable program code for causing the computer to execute a second local task to the contents of a plurality of generalized boxes of the said next lower level to minimize a global penalty function.

14. The computer usable medium of claim 13, wherein the hierarchy includes intermediate levels between a top level and the bottom level, and each of the top and intermediate levels contains an integer number of generalized boxes of $$\frac{n+x}{N},$$

where n is an integer identifying the number of generalized boxes in the next lower level and N is an integer greater than 1 and x is an integer selected from 0,1 , . . . , N−1.

15. The computer usable medium of claim 14, where N=2.

16. The computer usable medium of claim 13, wherein the computer readable program further includes:

fifth computer readable program code for causing the computer to iteratively repeat execution of the third and fourth computer readable program code until all of the objects are in the generalized boxes in the bottom level.

17. The computer usable medium of claim 13, wherein the fourth computer readable program code includes:

sixth computer readable program code for causing the computer to place each object from a generalized box of a higher level in a generalized box in the lower level having room for the object, and seventh computer readable program code for causing the computer to determine if plural generalized boxes in the lower level has room for the object, and to place the object in that generalized box in the lower level generating the minimal penalty function.

18. The computer usable medium of claim 13, wherein the seventh computer readable program code further includes:

computer readable program code for causing the computer to sort the objects in a three-dimensional array, computer readable program code for causing the computer to write objects to two of the generalized boxes in decreasing order of penalty based on a one-dimensional array derived from the three dimensional array, computer readable program code for causing the computer to compute a two-dimensional penalty matrix for the generalized boxes, and computer readable program code for causing the computer to map the position of the objects to the generalized boxes of the level based on the penalty.

19. The computer usable medium of claim 18, wherein the objects are mapped to at least four generalized boxes.

20. The computer usable medium of claim 19, further including sixth computer readable program code for causing the computer to repeat execution of the fourth computer readable program code to minimize global penalty.

* * * * *